United States Patent [19]

Rowlands et al.

[11] Patent Number: 4,961,209
[45] Date of Patent: Oct. 2, 1990

[54] SYSTEM FOR MEASURING THE CHARGE DISTRIBUTION ON A PHOTORECEPTOR SURFACE

[75] Inventors: John A. Rowlands, Toronto; Naoum Araj, Montreal; Herbert J. Davis, Beaconsfield, all of Canada

[73] Assignee: Noranda, Inc., Toronto, Canada

[21] Appl. No.: 278,274

[22] Filed: Nov. 30, 1988

[30] Foreign Application Priority Data

Dec. 1, 1987 [CA] Canada ................................. 553214

[51] Int. Cl.$^5$ .......................................... G03G 15/044
[52] U.S. Cl. ........................................ 378/29; 378/28; 378/31; 378/33
[58] Field of Search ................................ 378/28–33; 250/327.22

[56] References Cited

U.S. PATENT DOCUMENTS 4,085,327 4/1978 Swank et al. ........................ 378/29
4,204,725 5/1980 DiStefano et al. .

Primary Examiner—Carolyn E. Fields
Assistant Examiner—David P. Porte
Attorney, Agent, or Firm—Fleit, Jacobson, Cohn, Price, Holman & Stern

[57] ABSTRACT

A system for measuring the charge distribution on a photoreceptor plate which has been exposed to X-ray radiations to form an image of an object thereon is disclosed. The system comprises a transparent sensor electrode adapted to be positioned over the photoreceptor plate, means for scanning a pulsed laser beam through the transparent sensor electrode to discharge the photoreceptor surface charge pixel-by-pixel and so induce a corresponding voltage on the sensor electrode to be read by a suitable read-out device, such sensor electrode being of sufficient width so as to achieve good capacitive coupling with the region around the area to be discharged by the laser, and means for moving the sensor electrode or the photoreceptor plate step by step or continuously transversely of the laser scanning direction for reading out the image impressed on the photoreceptor surface.

6 Claims, 6 Drawing Sheets

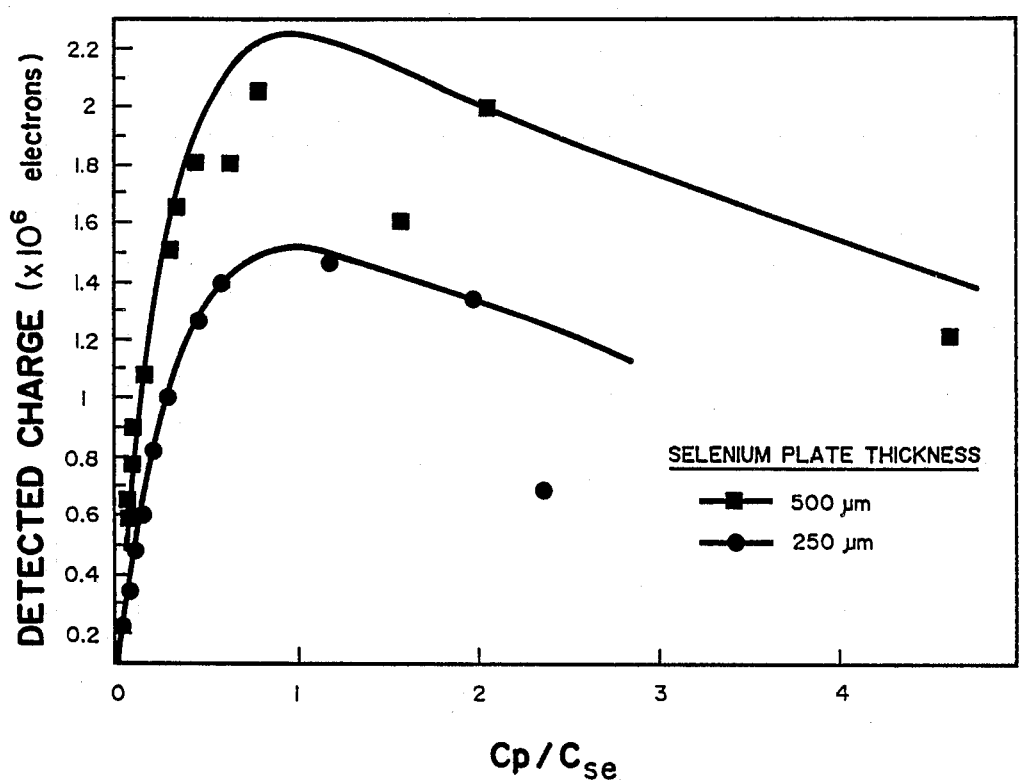
F I G . 3

$\boxed{T_1 \ne T_2 \ne T_3 \ne T_4}$ $\boxed{T_1 = T_2 = T_3 = T_4}$ laser beam off axis      centered laser beam

SYSTEM FOR MEASURING THE CHARGE DISTRIBUTION ON A PHOTORECEPTOR SURFACE

This invention relates to a system for measuring the charge distribution on a photoreceptor surface and, in particular, to its application to digital radiography.

The production of X-ray images has been historically achieved by chemically developing a silver halide film, which has not been exposed to light but only to the X-ray flux from an X-ray tube which penetrates a subject. This techndique is well known and need not be described in detail. The sensitivity of such methods is increased by using layers of materials which give off light when exposed to X-rays and which are included as screens in close proximity to the X-ray films inside a cassette. Although this film/screen technique increases sensitivity, the use of fluorescent screens of high X-ray absorption decreases the resolution of the image, which can only be enhanced within the limitations of the chemical film development methods used.

Another method for producing X-ray images has also found widespread acceptance, particularly for mammography. This technique, termed xeroradiography, utilizes a charged selenium photoreceptor as the X-ray receptor and the image is developed by exposing the partially discharged plate, as caused by the X-ray flux falling on the plate during X-ray exposure, to a toner development method. This technique produces an image similar to that obtained with film, but with a better sensitivity and an enhanced ability to image small, low-contrast objects. This xeroradiographic technique is described in more detail in texts such as "Electrophotography" by R. M. Schaffert (Focal Press 1975).

It has been recognized that an ability to convert the X-ray flux pattern representative of a radiograph into an equivalent electrical signal could have advantages in terms of image manipulation and its optimization for diagnosis. Other benefits in terms of image storage and transmission could also be realized by such a system. The problem, up to this time, has been to retain adequate resolution and X-ray sensitivity for diagnostic and X-ray dose considerations. A number of prior developments have addressed the need for obtaining electrical signals from radiographs, but these all have shortcomings.

Initial attempts to use digital image processing techniques for radiography involved scanning film radiographs with a light-based microdensitometer so as to obtain an electrical analog of the optical transmission distribution on the X-ray film. This method obviously has several limitations. The results can only be as good as the film system used to obtain the radiograph and there is a considreable delay between X-ray exposure and the acquisition of a digitally processed image. Commercial digitizers of this type are, however, available.

Systems using an electrostatic imaging technique have been developed by ADAC Laboratories and Philips GmbH. Selenium plates are corona charged and exposed to the modulated X-ray beam in much the same manner as current X-ray film cassettes are used. The latent X-ray image (caused by partial discharge of the surface charge by X-ray absorption throughout the selenium thickness) is then read out by mechanically scanning the surface of the plate with a row of microelectrometers. The electrometers are moved slowly, in relation to the plate, so as to scan the whole surface. This read-out method has shown a relatively low modulation transfer function. The electrical field perturbation due to the finite probe dimensions, the difficulties in precisely controlling the microprobe spacing over large areas, and the need to effectively decouple each microelectrometer from its neighbours are almost exclusively responsible for the limited resolution (less than 2 linepairs/mm) of this type of system.

A system using a laser read-out method has been disclosed in Canadian Patent No. 1,155,562 granted Oct. 18, 1983. In this system, the surface charge distribution is read-out by scanning each pixel with a pulsed laser beam. The laser beam causes the remaining charge for each pixel to be neutralized and a signal corresponding to its magnitude is generated in an external measuring circuit. The analog current signal is then digitized and processed. The detector system consists of a transparent dielectric layer, with a transparent conductive coating, which is placed in close contact (glued) with a photoconductive insulative layer (e.g., selenium). A charging regime is then used to cause a charge to be generated at the interface of the selenium which is in contact with the dielectric layer. This charged structure is exposed to X-rays and the remaining charge at the interface represents the latent X-ray image. The charge distribution is read out by monitoring the current flow to the upper conductive layer as the charge on each pixel is neutralized. A basic problem with this approach is that the dielectric sheet with the transparent conductive coating has to be of large area, covering the whole surface of the X-ray plate, and consequently when the laser discharges a single pixel, measurement of the small induced charge has to be made in the presence of a large capacitor. This capacitor is necessarily connected across the input of the signal preamplifier, which creates an unacceptable level of noise, (unless pixels are made huge) reducing the sensitivity of the method. Also, the charging method of this invention is somewhat cumbersome and could give rise to imaging defects. Indeed, since the selenium layer is physically inaccessible, to place a charge on its surface, the structure has to be illuminated during the charging process, prior to the X-ray radiation. This charging method enhances the dark conductivity of the selenium and generates a non-uniform charge distribution on its surface.

It is the object of the present invention to provide a system for measuring the charge distribution on a photoreceptor surface which overcomes the difficulties associated with the X-ray imaging systems described above.

The system, in accordance with the present invention, comprises a transparent sensor electrode adapted to be positioned over the photoreceptor plate, means for scanning the photoreceptor surface with a pulsed laser beam through the transparent sensor electrode to discharge the photoreceptor surface charge pixel-by-pixel and so induce a corresponding voltage on the sensor electrode to be read by a suitable read-out device, and means for moving the sensor electrode or the photoreceptor plate step by step, or continuously, transversely of the laser scanning direction for reading out the image impressed on the photoreceptor surface. The sensor electrode is of sufficient width so as to achieve good capacitive coupling with the region around the area to be discharged by the laser.

The width of the sensor electrode preferably is more than two times the laser beam diameter.

For a grounded sensor electrode and a grounded photoreceptor substrate, the sensor electrode is preferably separated from the photoreceptor plate by a distance, such that the capacitance per unit area of the air gap between the sensor electrode and the photoreceptor plate is nearly equal to the capacitance per unit area of the photoreceptor plate.

A fluid dielecric may be used instead of air in the gap between the sensor electrode and the photoreceptor plate to operate at larger separation while maintaining optimum capacitive coupling.

The system in accordance with the present invention preferably further comprises means for maintaining constant separation of the sensor electrode from the photoreceptor surface along the full length of the sensor electrode. Such means may include a capacitance structure at each end of the sensor, a capacitance meter associated with each capacitance structure for measuring such capacitance as an indication of the sensor electrode to photoreceptor plate separation and means responsive to such capacitance meter for adjusting the electrode/plate separation so as to maintain constant separation all along the sensor electrode.

The system in accordance with the present invention preferably further comprises means for aligning the laser beam along the length of the sensor electrode. Such means may consist of an opaque block located on each end of the sensor electrode and having a transparent slit transversing therethrough at a 45 degree angle, means for scanning the laser beam along the axis of the sensor electrode and through the slit in such opaque structure, and means for measuring the time the beam is obscured from the centre of each slit to the edges of each block as an indication of laser beam offset.

The invention will now be disclosed by way of example with reference to a preferred embodiment illustrated in the accompanying drawings in which:

FIG. 1 shows an embodiment of a basic scanning arrangement of a photoreceptor plate by a sensor electrode;

FIGS. 2(a) and 2(b) show various sensor electrode arrangements;

FIG. 3 shows the expected charge induced in a read-out device as a function of the sensor electrode to selenium photoreceptor plate separation.

FIGS. 4(a) and 4(b) show a practical example of a transparent sensor electrode;

FIGS. 5(a), 5(b), 5(c), 5(d) and 5(e) are diagrams showing a sensor electrode alignment procedure;

Figure 1:
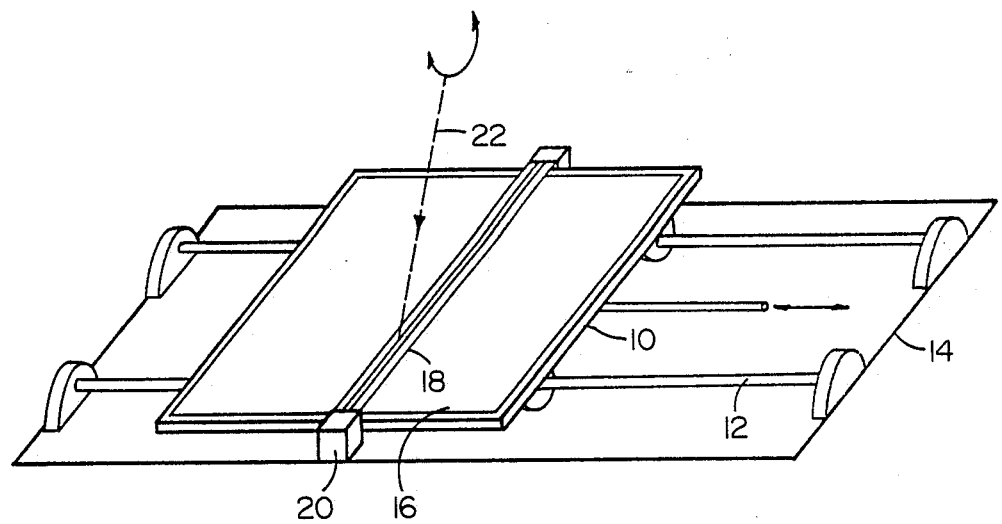

Referring to FIGS. 1 and 2, there is shown a moving table 10 which is mounted on sliding bearings 12 secured to an optical bench 14. The moving table supports a photoreceptor plate 16 which may be made of any suitable material such as selenium coated onto an aluminum substrate 17. A sensor electrode or probe 18 is mounted over the photoreceptor plate on a supporting structure 20 secured to the optical bench 14. The sensor electrode or probe shown in FIG. 1 is a metal strip having a longitudinal slit therein of a sufficient width to allow the passage of a laser beam 22 which is scanned across the plate through the slit in the electrode. The table 10 is moved on sliding bearings 12 using any suitable drive capable of advancing the photoreceptor plate step by step transversely of the laser beam scanning direction.

In operation, an electrostatically charged photoreceptor plate, which has been exposed to X-ray radiations to form a latent X-ray image of an object on the photoreceptor surface, is placed on the moving table 10 and is scanned transversely by a pulsed laser beam 22. The laser beam causes the photoreceptor charge for each pixel to be neutralized and a signal corresponding to its magnitude is induced in the sensor electrode 18.

Figures 2A, 2B:
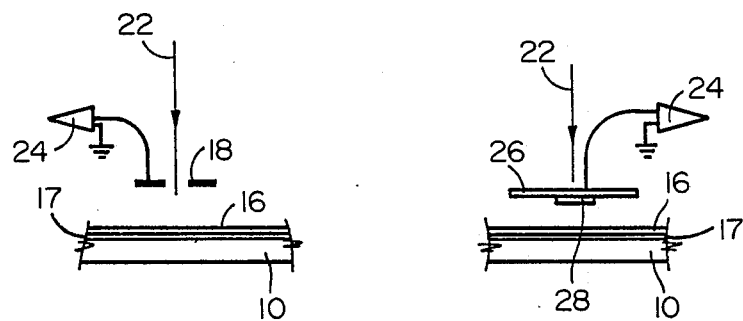

As shown in FIG. 2(a), this signal is fed to a preamplifier 24 which is connected to an external measuring circuit to be disclosed later. When a full scan across the photoreceptor plate has been completed pixel-by-pixel, the photoreceptor plate is moved longitudinally by one pixel diameter and a new transverse scan is made. It is to be understood that the photoreceptor plate could be fixed and the sensor electrode movable. A scanning system has also been envisaged where the photoreceptor plate is continuously moving (as opposed to step by step) with respect to the sensor electrode, during the laser scanning speed has to be adjusted in concert with the laser pixel size and the width of the plate so as to produce contiguous scans across the plate.

In contrast to the electrostatic read-out approach, where the image resolution is exclusively determined by the dimension of the microelectrometers, the distance between electrometers and the selenium surface and the thickness of the selenium detector, the image resolution (defined by the MTF) of the system in accordance with the present invention is almost independent of the above geometrical factors. The width of the probe, in the present system, has to be large enough with regard to the laser beam dimension in order to achieve good capacitive coupling with the region around the area to be discharged by the laser. The advantage of having a relatively large probe, instead of a narrow probe of about the pixel size of the laser beam, is that the charge induced in the probe in the particular area to be discharged by the laser beam is linearly proportional to the surface charge of the selenium plate. In this situation, the horizontal component of the electric field created by a high spatial modulation of surface charge or a discharged area is averaged to zero. Thus, in such a configuration, the MTF of the system is only limited by the laser spot size and the spatial sampling rate. The width of the sensor electrode should be more than two times the size of the laser beam. There is no advantage however in increasing the width of the sensor electrode to more than 30 mm as it would unduly increase the capaticance across the read-out device.

The separation of the probe of the surface of selenium is an important factor for optimizing the S/N ratio of the x-ray signal. Extensive work has been done to establish optimum probe to selenium spacings. For a grounded substrate and probe, the optimum result can be understood from the following argument. Suppose a positive charge of density $+\sigma se$ is initially deposited on the top surface of selenium. The negative charge density induced on the probe ($\sigma p$) and on the conductive substrate of selenium ($\sigma s$) will be such that:

$$\sigma se = -(\sigma p + \sigma s) \qquad (1)$$

As the probe gets closer to the surface of the selenium, the electrostatic charge induced in the probe increases as:

$$\sigma p = -\sigma se \frac{1}{1 + \frac{Cse}{Cp}} \quad (2)$$

where Ce represents the capacitance per unit area of the selenium photoreceptor and Cp the capacitance per unit area of the air gap between the probe and the top surface of selenium.

Consequently, the amount of charge still coupled to the conductive substrate of the selenium x-ray detector decreases as:

$$\sigma s = -\sigma se \frac{1}{1 + \frac{Cp}{Cse}} \quad (3)$$

Under the action of a pulse of light of short duration compared to the transit time of charges across the selenium thickness of the selenium plate, those neutralized charges which are free to move are only those coupled to the substrate. Thus, one would expect the signal flowing to the probe to increase at closer probe to selenium separations, due to the benefit of a better capacitive coupling. However, it has been found that the decrease in free charge able to move under the action of the laser beam, at very close separation, leads to a reduction of the signal induced in the probe, which may be expressed under the above argument as:

$$\sigma p \text{ (detected)} = \sigma s \times \frac{1}{1 + \frac{Cse}{Cp}} = -\sigma se \frac{CpCse}{(Cp + Cse)^2} \quad (4)$$

The optimal separation of the probe to the selenium photoreceptor, given by the condition $$\frac{\partial \sigma p}{\partial Cp} = 0,$$

has been determined to be that where the capacitance formed by the air gap between the probe and selenium top surface (Cp) is equal to the capacitance of the selenium layer (Cse), that is:

$$Cp = Cse \quad (5)$$

FIG. 3 shows the agreement between the expected theoretical and experimental measured signal induced in the probe as a function of the ratio of the air gap capacitance between the probe and the selenium plate to the selenium capacitance for two different selenium thicknesses.

In addition to the above argument, it must be understood that the substrate of the selenium layer (or the conductive probe) could be polarized to a positive or negative potential with respect to the ground. In such a case Cp would not be equal to Cse, but the effect of such an additional bias potential could result in a more flexible operational read-out system and one can take advantage of this benefit in order to enhance a particular parameter in image read-out.

Also, it must be understood that the probe to surface of selenium separation has to be such as to prevent self discharge of the photoreceptor charge onto the probe. In the case where the optimized separation is in the breakdown region for air, it has been found that a dielectric liquid or gas may be used to overcome field breakdown problems. Also the utilization of a dielectric fluid of the same or larger dielectric constant as selenium allows to operate at larger separations while maintaining the same optimum capacitive coupling. The microphonic noise due to random vibration of the probe is also reduced by a factor substantially equal to the ratio of the dielectric constant to air.

A slit-electrode having a width of 25 mm and positioned about 1 mm for the surface of a 150 um thick selenium plate was able to provide a sufficient signal to enable a good reproduction of the latent image on the selenium photoreceptor plate to be obtained. This image could be accurately reproduced even when the image was strongly modulated in the direction of travel of the slit-electrode.

A number of modifications to the basic sensor electrode arrangement shown in FIG. 2(a) have been investigated. Improvements in signal have been achieved by decreasing the sensor electrode to photoreceptor surface separation, using a transparent glass sensor electrode 26 provided with a transparent conductor 28 through which the laser beam is shone as illustrated in FIG. 2(b) and reducing the width of the sensor electrode to 2 or even 0.5 mm.

Figure 4A:
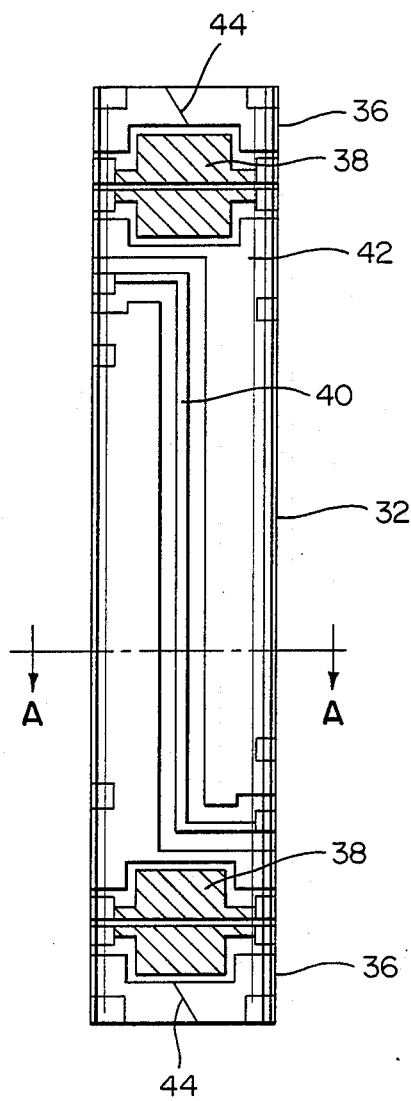
Figure 4B:
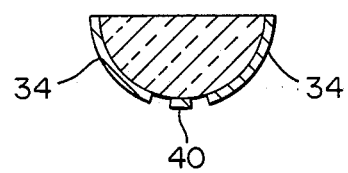

More practical realizations of sensor electrode structure, however, contain various features to improve its operation. The embodiment shown in FIGS. 4(a) and 4(b) is an example of one such improved structure, which is representative, but not restrictive as to the nature of the features which can be incorporated into the probe structure in order to improve its operation. The read-out probe shown in FIGS. 4(a) and 4(b) is a solid state device prepared by photolithographic processes on a common semi-cylindrical glass lens substrate. In order to achieve accurate alignment and positioning of the sensor electrode or probe over the photoreceptor plate, several components have been integrated to the probe. The readout probe is thus composed of four components: a transparent sensor electrode designated generally by reference numral 32, an electromagnetic interference shield 34, laser alignment components 36 and capacitance structures 38 for probe micropositioning. However, the number of devices integrated to the sensor electrode is not necessarily limited to these four.

The transpatent sensor electrode 32 consists of a sputteredum tin oxide (ITO) transparent conductive layer 40, centered with respect to a semi-cylindrical glass lens 42. The layer has a typical sheet resistance of 30 ohms/square and over 75% transmission for the visible spectrum.

The width of the probe has been chosen in order to optimize the characteristic performance of the read-out system. As mentioned previously, a very narrow probe of about the pixel size of the laser would be desirable in order to reduce the microphonic noise associated with the random vibration of the probe with respect to the plate. However, a very narrow probe has a substantial limitation in terms of image resolution. A probe dimension of 1 mm in width has proven to be very satisfactory.

The transparent sensor electrode is shielded from external electromagnetic interference by a nickel, chromium and gold multilayer shield 34 that effectively surrounds it.

To assist in accurately aligning the laser read-out beam along the transparent electrode, there is a narrow transparent slit 44 transversing, at a 45 degree angle, an opaque rectangle at the top of the probe. The centre of each slit coincides (lengthwise) with the central axis of the transparent electrode.

Figure 5D:
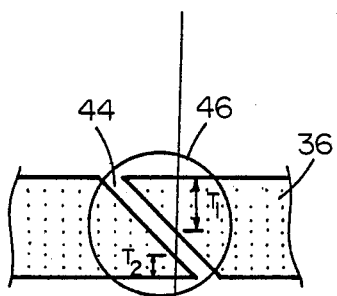
Figure 5D:
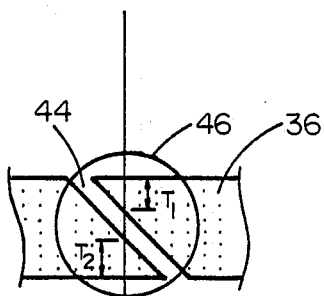
Figure 5D:
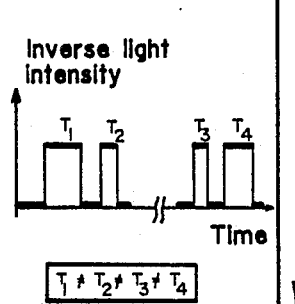
Figure 5E:
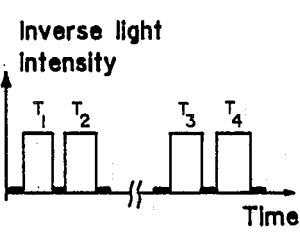
Figure 5A:
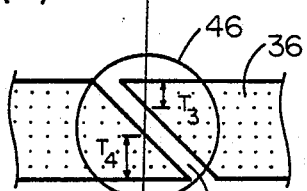
Figure 5B:
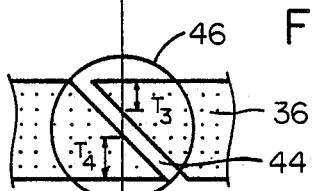
Figure 5C:
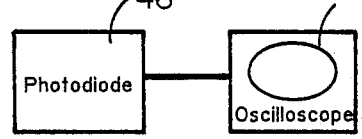

During the alignment procedure, as shown in FIGS. 5(a), 5(b) and 5(c) a photodiode detector 46 is placed behind each of the slits 44 and the detector output is connected to an oscilloscope 47. The scanning laser beam is then shone along the axis of the probe. The probe structure is positioned in such a way that the time the laser beam is obscured from the top edge of each rectangle to the centre of each slit ($T_1$ and $T_3$) and the time the beam is obscured from the centre of each slit to the bottom edge of each rectangle ($T_2$ and $T_4$) are equal. The above measurements are all performed separately for the top and bottom structures. FIG. 5(d) shows the inverse light intensity diagram seen on the oscilloscope when the laser beam is offset and FIG. 5(e) the inverse light intensity diagram when the laser beam is centered. When all the times are equal, the laser beam is centrally traversing the transparent probe.

In addition to the alignment structures, there are two capacitance structures 38 at the top and bottom of the probe. These structures consist of flat conducting pads. When the probe is positioned near the photoreceptor plate to be read out, a capacitance is formed between the pads and the plate. The capacitance of the pads with respect to selenium surface of the plates is inversely proportional to the separation of the pads from the plate.

Figure 6:
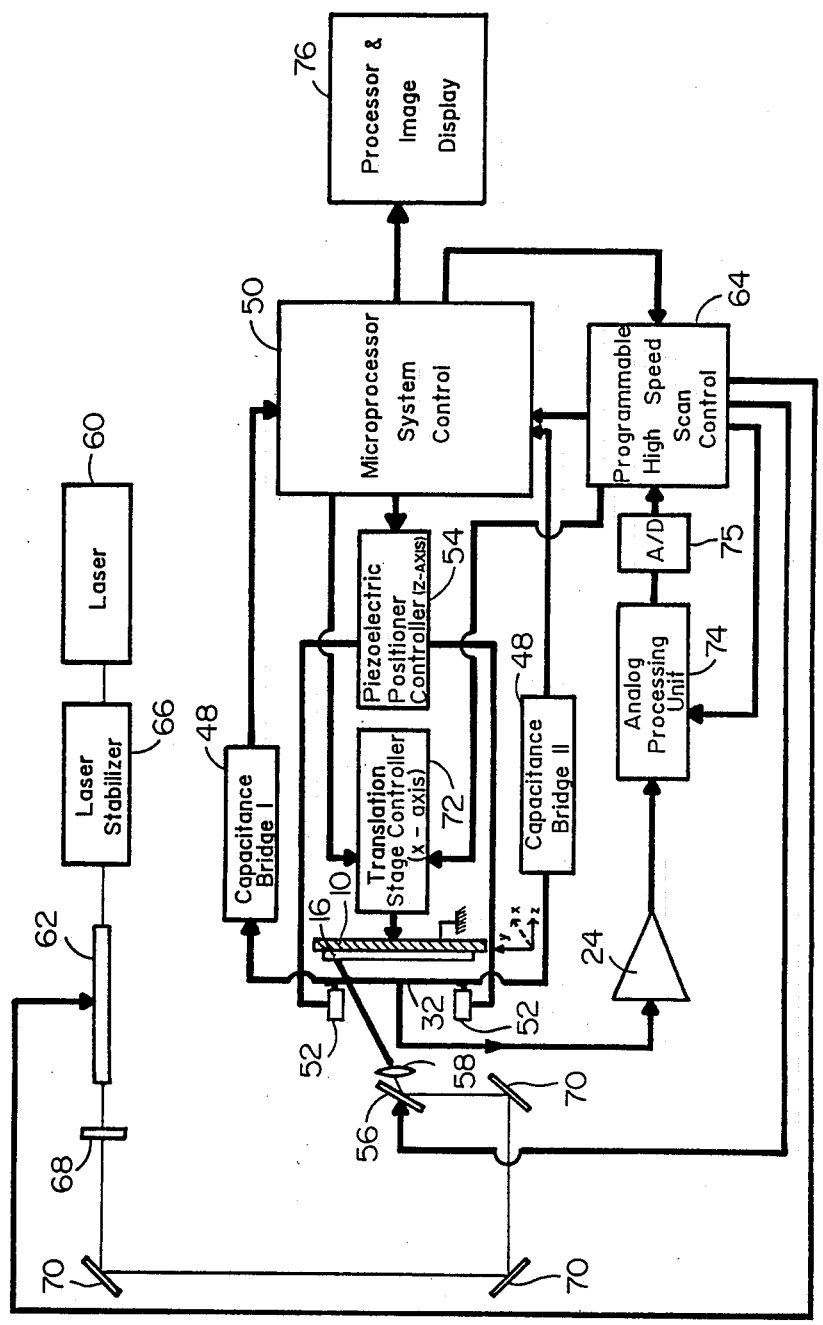
FIG. 6 is a diagram of a photoreceptor plate scanning system.

Referring now to FIG. 6, the capacitance of the top and bottom structures are very precisely measured using conventional bridge-type capacitance meters 48. The capacitance is measured directly whilst a phase signal from the bridge indicates whether or not the probe/plate separation is greater or less than a predetermined separation. The output of each capacitance meter is fed to a microprocessor system control 50. Using piezoelectric micropositioners 52 (one at both the top and bottom of the probe structure) under the control of a piezoelectric positioner controller 54 which is responsive to microprocessor 50, it is possible to precisely move the probe in such a way that the capacitance structures are equal. When this condition is true, the probe/plate separation is constant from top to bottom of the probe. This is essential for maintaining signal uniformity along a scan.

The selenium plate scanning system consists of a conventional optical assembly and a conventional processing and digital control. In the present setup, a galvanometer 56 is used to scan a blue laser beam (440 nm) through a F-Theta lens 58 and onto the selenium plate 16. The laser beam itself is generated by a laser 60 and modulated into properly timed pulses by the use of an acousto-optic modulator 62 responsive to a programmable high speed scan control 64 under the control of microprocessor 50. The laser itself is stabilized by an electro-optic stabilizer 66. The laser beam passes through a neutral density filter 68 and is deflected by mirrors 70 onto galvanometer 56. The beam passes through the sensor electrode 32 on its path from the lens 58 to selenium plate 16. The surface charge on the selenium plate induces a counter-charge on the electrode which is proportional to the charge on the plate. When the light reaches the selenium plate, the surface charge in the region of light incidence migrates to the conductive substrate of the plate, which is at a lower electric potential. This causes a simultaneous movement of charge in the electrode which is then detected by charge sensitive pre-amplifier 24. A translation stage controller 72 is provided for moving the photoreceptor support table 10 transversely to the scanning laser beam at the end of each scan. The translation stage controller is under the control of the microprocessor system control.

The analog signal at the output of the preamplifier 24 is then processed through an analog processing unit 74 and digitized by an A/D converter 75 and stored in digital form in microprocessor 50 and can be viewed and disseminated at command using a processor and image display 76. The synchronization and coordination of scanning activities plus data storage, may be managed by a Motorola 68000 microprocessor system and associated realtime scan logic. The details and timing of the scan process and data acquisition need not be discussed here.

Area radiographs have been obtained with the above system and while not representative of the limiting performance of the system, they do serve to indicate the utility of the invention. The objective measurements made from such images are summarized in Table 1 and FIG. 7.

TABLE I

Figure 7:
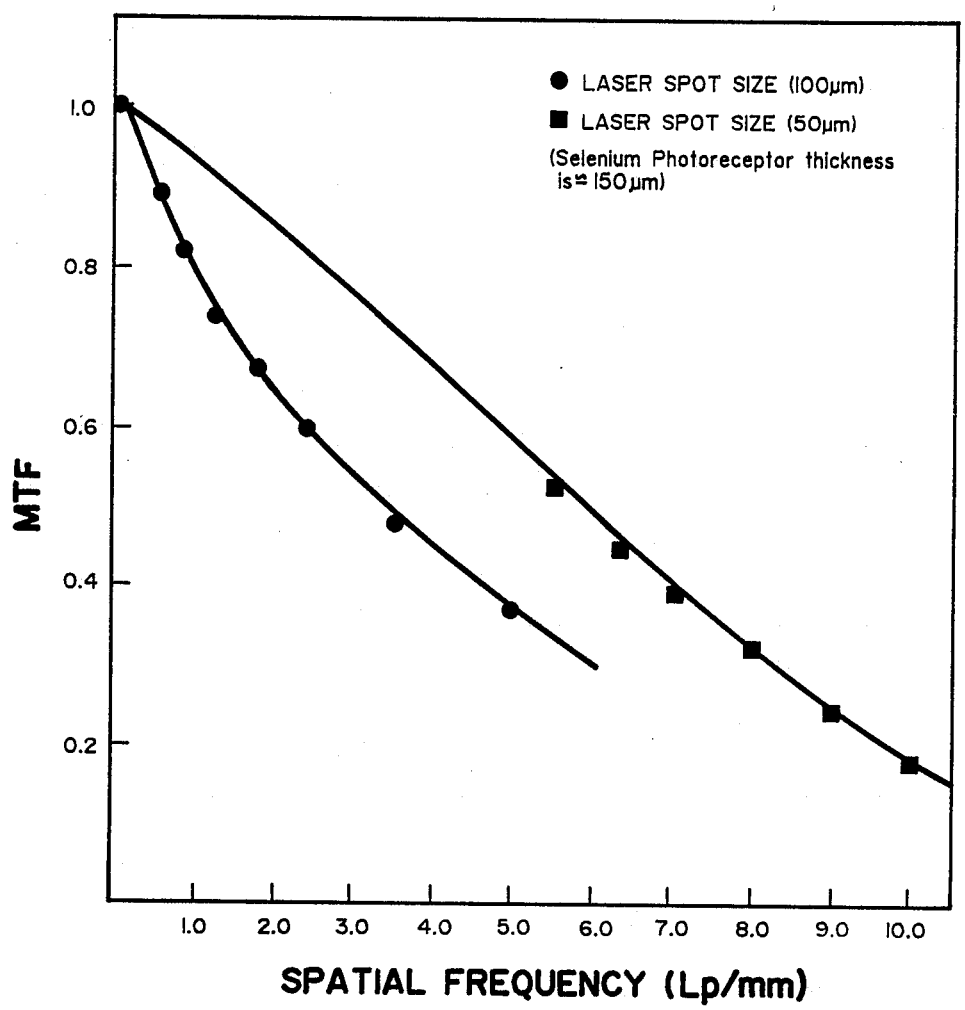
FIG. 7 shows modulation transfer functions (MTFs) of selenium plates read out with a laser scanner.

| | RESULTS OBTAINED WITH TWO TYPES OF SENSOR ELECTRODE | | | | | | | |
|---|---|---|---|---|---|---|---|---|
| Initial Voltage Volts | Sensor Electrode | Probe Separation | Electronic Noise ($10^{-15}$ Coul) | System Noise ($10^{-15}$ Coul) | Total Readout Noise ($10^{-15}$ Coul) | Average Signal ($10^{-15}$ Coul) | Average Signal Readout Noise | MTF |
| 1000 | 25 mm Slit Electrode | 1 mm | 0.17 | 0.32 | 0.32 | 23.3 | 73 | |
| 1000 | 2 mm Semi Transparent Gold | 1 mm | 0.06 | 0.22 | 0.22 | 23 | 105 | |
| 2000 | 1 mm Transparent Conductive ITO | 0.2 mm | 0.06 | 0.19 | 0.28 | 323 | 1150 | FIG. 7 |

The overall results are very encouraging. For example, in the area of spatial resolution, measured by modulation transfer function (MTF), the results are excellent. The MTFs shown in FIG. 7 are for a selenium coated plate with a selenium thickness of 150 um, measured with a 1 mm wide transparent conductive ITO electrode on glass. The MTF curves are for two different laser spot sizes and spatial sampling rates. For a 100 um laser spot diameter and 10 samples/mm, a resolution of 5 lp/mm has been easily attained. Also, as expected from theory, by increasing the sampling rate to 20 samples/mm and using a 50 um laser spot size a resolution of 10 lp/mm has been achieved.

Although the invention has been disclosed with reference to preferred embodiments it is to be understood that various alternatives are envisaged within the scope of the following claims. For example, multiple probes and amplifiers combined with more elaborate laser scanning would permit sensing more than one pixel at the same time, thus permitting the read-out rate to be increased by a factor equal to the total number of amplifiers employed. In addition, the surfaces of the probe can be modified to minimize reflections of the laser beam.

We claim:

1. A system for measuring the surface charge distribution on a photoreceptor plate which has been exposed to X-ray radiation to form an image of an object thereon, said system comprising:
   (a) a transparent sensor electrode and means for positioning the electrodes over the photoreceptor plate;
   (b) means for scanning a pulsed laser beam through the transparent sensor electrode to discharge the photoreceptor plate surface charge pixel-by-pixel and so induce a corresponding voltage on the sensor electrode to be read by a read-out device, said sensor electrode being of sufficient width so as to achieve good capacitive coupling with the region around the area to be discharged by the laser; and
   (c) means for moving one of the sensor electrode and the photoreceptor plate in one of a step by step transverse movement and continuous transverse movement of the laser scanning direction for reading out the image impressed on the photoreceptor surface.

2. A system as defined in claim 1, wherein the width of the sensor electrode is more than two times the laser beam diameter.

3. A system as defined in claim 1, wherein, for a grounded photoreceptor substrate and a grounded sensor electrode, the sensor electrode is separated from the photoreceptor plate by a distance such that the capacitance per unit area of the air gap between the sensor electrode and the photoreceptor plate is nearly equal to the capacitance per unit area of the photoreceptor plate.

4. A system as defined in claim 1, wherein a fluid dielectric is used in a gap between the sensor electrode and the photoreceptor plate.

5. A system for measuring the surface charge distribution on a photoreceptor plate which has been exposed to X-ray radiation to form an image of an object thereon, said system comprising:
   (a) a transparent sensor electrode and means for positioning the electrode over the photoreceptor plate;
   (b) means for scanning a pulsed laser beam through the transparent sensor electrode to discharge the photoreceptor plate surface charge pixel-by-pixel and so induce a corresponding voltage on the sensor electrode to be read by a suitable read-out device, said sensor electrode being of sufficient width so as to achieve good capacitive coupling with the region around the area to be discharged by the laser;
   (c) means for moving the sensor electrode or the photoreceptor plate step by step or continuously transversely of the laser scanning direction for reading out the image impressed on the photoreceptor surface; and
   (d) means for maintaining constant separation of the sensor electrode from the photoreceptor plate along the full length of the sensor electrode, said means comprises a capacitance structure mounted at each end of the sensor electrode, a capacitance meter associated with each capacitance structure for measuring such capacitance as an indication of the sensor electrode to photoreceptor plate separation, and means for moving said sensor electrode so as to maintain constant separation all along the sensor electrode.

6. A system for measuring the surface charge distribution on a photoreceptor plate which has been exposed to X-ray radiation to form an image of an object thereon, said system comprising:
   (a) a transparent sensor electrode and means for positioning the electrode over the photoreceptor plate;
   (b) means for scanning a pulsed laser beam through the transparent sensor electrode to discharge the photoreceptor plate surface charge pixel-by-pixel and so induce a corresponding voltage on the sensor to be read by a suitable read-out device, said sensor electrode being of sufficient width so as to achieve good capacitive coupling with the region around the area to be discharged by the laser;
   (c) means for moving the sensor electrode or the photoreceptor plate step by step or continuously transversely of the laser scanning direction for reading out the image impressed on the photoreceptor surface; and
   (d) means for aligning the laser beam along the length of the sensor electrode, said means comprises an opaque block located at each end of the sensor electrode and having a transparent slit transversing therethrough at a 45 degree angle, means for scanning the laser beam along the axis of the sensor electrode and through the slit in each opaque block, and means for measuring the time the beam is obscured from the center of each slit to the edges of each block as an indication of laser beam offset.

* * * * *